United States Patent
Liu et al.

(10) Patent No.: US 6,188,243 B1
(45) Date of Patent: *Feb. 13, 2001

(54) INPUT/OUTPUT CIRCUIT WITH HIGH INPUT/OUTPUT VOLTAGE TOLERANCE

(75) Inventors: Jiunn-Fu Liu, Hsinchu; Tai-Shou Lin, Tainan Hsien; Jung-Sung Weng, Taoyuan; Yun-Chyi Yang, Chupei, all of (TW)

(73) Assignee: United Integrated Circuits Corp., Hsinchu (TW)

( * ) Notice: Under 35 U.S.C. 154(b), the term of this patent shall be extended for 0 days.

This patent is subject to a terminal disclaimer.

(21) Appl. No.: 09/329,112

(22) Filed: Jun. 9, 1999

(51) Int. Cl.[7] ............................................. H03K 19/0175
(52) U.S. Cl. ............................. 326/81; 326/24; 327/333
(58) Field of Search ....................... 326/81, 24; 327/333, 327/374, 379

(56) References Cited

U.S. PATENT DOCUMENTS 4,833,349 * 5/1989 Liu et al. ................................. 326/50
5,381,062 * 1/1995 Morris ..................................... 326/68
5,969,563 * 10/1999 Shih et al. .............................. 327/333

* cited by examiner

*Primary Examiner*—Huan Hoang
*Assistant Examiner*—Gene N. Auduong
(74) *Attorney, Agent, or Firm*—J. C. Patents; Jiawei Huang (57) ABSTRACT

An input/output (I/O) circuit with a high I/O voltage tolerance is provided for use in conjunction with an IC device that operates with two system voltages, such as 3.3 V and 5 V. The particular circuit configuration of this I/O circuit allows it to be fabricated using the Single Gate-Oxide technology instead of the Double Gate-Oxide technology, so that the manufacturing cost can be reduced as compared to the prior art. Moreover, this I/O circuit allows an output impedance lower than that of the prior art, allowing the signal transmission speed via this I/O circuit to be increased by about 30% as compared to the prior art. It can also help eliminate the problems of poor gate oxide reliability, PN junction inversion, and PMOS leakage that otherwise occur in the prior art. Furthermore, this I/O circuit can help eliminate the DC leakage current in the input-stage circuit, so that the power consumption can be reduced compared to the prior art.

10 Claims, 4 Drawing Sheets

INPUT/OUTPUT CIRCUIT WITH HIGH INPUT/OUTPUT VOLTAGE TOLERANCE

BACKGROUND OF THE INVENTION

1. Field of the Invention

This invention relates to input/output (I/O) circuits for integrated circuit (IC) devices, and more particularly, to an I/O circuit with a high I/O voltage tolerance.

2. Description of Related Art

An integrated circuit (IC) device is capable of holding a very great number of circuit components, including resistors, capacitors, and transistors, in a very small semiconductor chip made of silicon or gallium arsenide. An IC chip is typically 1 cm² to 2 cm² in size and 1 mm in thickness.

An IC device is composed of various conductive, semiconductive, and insulative components. In a metal-oxide semiconductor (MOS) IC device, when a voltage is applied to the conductive and semiconductive layers, a certain amount of electric charges accumulates at the PN junctions. When the applied voltage is increased to a certain level (called threshold voltage), it causes type inversion to some semiconductor components in the MOS IC device, i.e., P-type layers are inverted to N-type, and N-type layers are inverted to P-type. If the MOS IC device is of the type that has a pair of semiconductor regions on both sides of each data-storage capacitor in the MOS IC device and these regions are opposite in type to the associated MOS transistor, the type inversion of these regions cause them to be electrically connected.

Moreover, when the voltage applied to an IC device further exceeds a certain level (called breakdown voltage), it causes the IC device to break down, and even causes damage to the PN junctions and gate oxide of the MOS transistors in the IC device, thus leading to the occurrence of leakage current. It can even cause the IC device to burn down if the voltage exceeds the breakdown voltage by too much.

In IC device operating on two system voltages, for example 3.3 V and 5 V, and the 3.3 V circuitry and the 5 V circuitry share a common bus. Then, when the bus is used to transfer 5 V logic signals, it can cause stress to the 3.3 V circuitry, and thus is likely to cause damage to the PN junctions and gate oxides of the MOS transistors in the 3.3 V circuitry.

One solution to the foregoing problem is to use what is known as Dual Gate-Oxide technology, which can help increase the breakdown voltage and the time-dependent dielectric breakdown (TDDB) characteristic of the MOS transistors in the IC device. The TDDB characteristic is related to the reliability of the resulting IC device. One drawback to the Dual Gate Oxide technology, however, is that it is more costly to implement than the Single Gate-Oxide technology, approximately by 15%.

Figure 1:
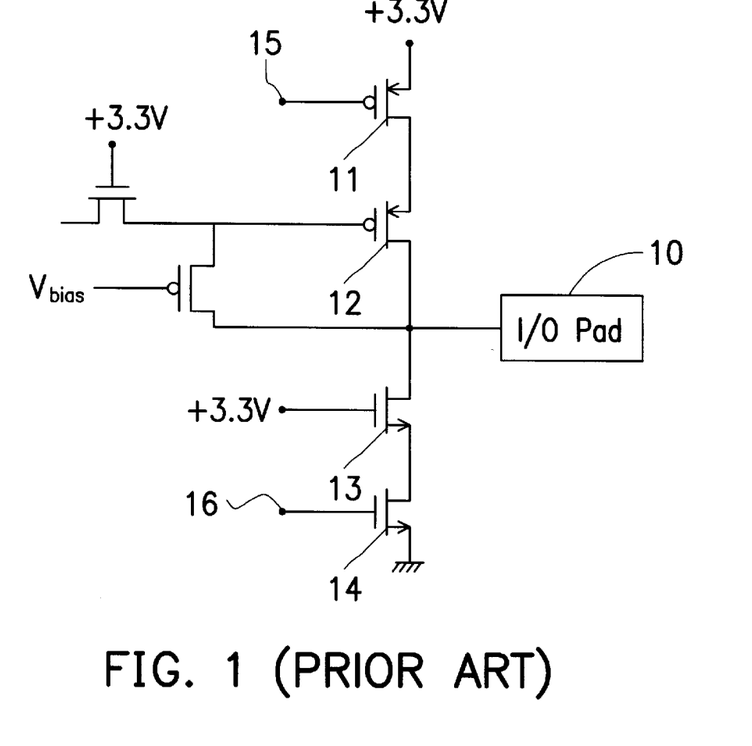
FIG. 1 is a schematic diagram of a conventional I/O circuit.

One solution to the foregoing problem is disclosed in U.S. Pat. No. 5,381,062 to AT&T, entitled "MULTI-VOLTAGE COMPATIBLE BIDIRECTIONAL BUFFER", and whose basic circuit configuration is illustrated in FIG. 1. As shown, this patented I/O circuit includes an I/O pad 10, a first PMOS transistor 11, a second PMOS transistor 12, a first NMOS transistor 13, and a second NMOS transistor 14. The first PMOS transistor 11 is connected in such a manner that its gate is connected to a first node 15 which is further connected to a first driver (not shown) for control of the ON/OFF state of the first PMOS transistor 11, while the second NMOS transistor 14 is connected in such a manner that its gate is connected to a second node 16 which is further connected to a second driver (not shown) for control of the ON/OFF state of the second NMOS transistor 14.

The I/O pad 10 is coupled to an output port of a 5 V IC device (not shown) for receiving a 5V system voltage therefrom. At output enable when the 5V system voltage is being input to the I/O pad 10, the sourcing of the 5 V system voltage is directed through the first and second PMOS transistors 11, 12, while the sinking of the same is directed through the first and second NMOS transistors 13, 14. The ON/OFF state of the first PMOS 11 is controlled by a first gate voltage signal applied by the first driver (not shown) to the node 15, while the ON/OFF state of the second NMOS 14 is controlled by a second gate voltage signal applied by the second driver (not shown) to the node 16. The I/O circuit of FIG. 1 can provide a reliable oxide layer and no leakage current in the PMOS transistors 11, 12 and thus can protect the 3.3 V circuitry from the 5 V system voltage.

One drawback to the foregoing I/O circuit of FIG. 1, however, is that the particular configuration of the PMOS transistors 11, 12 and the NMOS transistors 13, 14 makes the output impedance of the I/O circuit considerably higher, thus causing the signal transmission speed to be undesirably slow.

Figure 2:
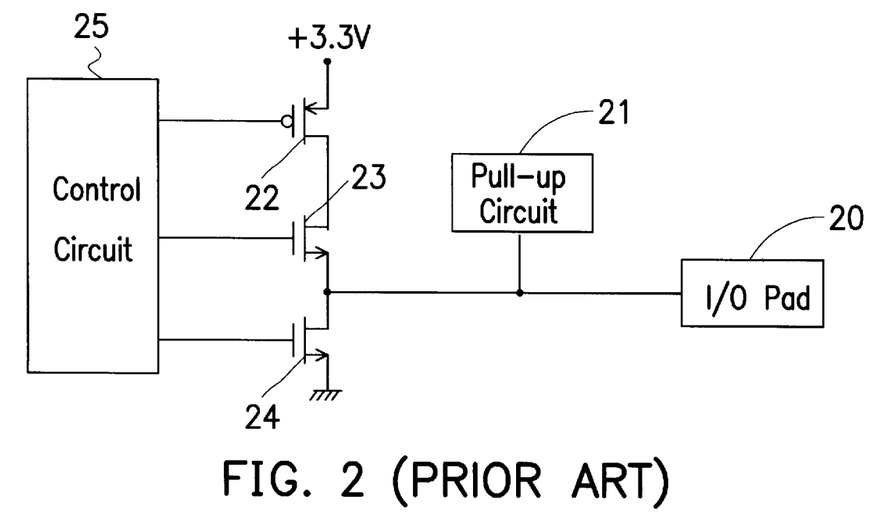
FIG. 2 is a schematic diagram of another conventional I/O circuit.

FIG. 2 shows another conventional I/O circuit, which is disclosed in U.S. Pat. No. 5,546,019 to TSMC (Taiwan Semiconductor Manufacture Corporation), entitled "CMOS I/O CIRCUIT WITH 3.3 V OUTPUT AND TOLERANCE OF 5 V INPUT". As shown, this patented I/O circuit includes an I/O pad 20, a pull-up circuit 21, a PMOS transistor 22, a pair of NMOS transistors 23, 24, and a control unit 25. The control unit 25 is used to control the ON/OFF states of the PMOS transistor 22 and the two NMOS transistors 23, 24. The particular configuration of the foregoing I/O circuit of FIG. 2 can help eliminate the problems of forward bias at the PN junction of the PMOS transistor 22 and achieve full swing by means of the pull-up circuit 21.

One drawback to the foregoing I/O circuit of FIG. 2, however, is that when the I/O circuit operates in high-impedance state, the input of the 5 V system voltage to the I/O pad 20 causes stress to the gate oxide of the NMOS transistor 24, which may make the I/O circuit unreliable to operate.

Figure 3:
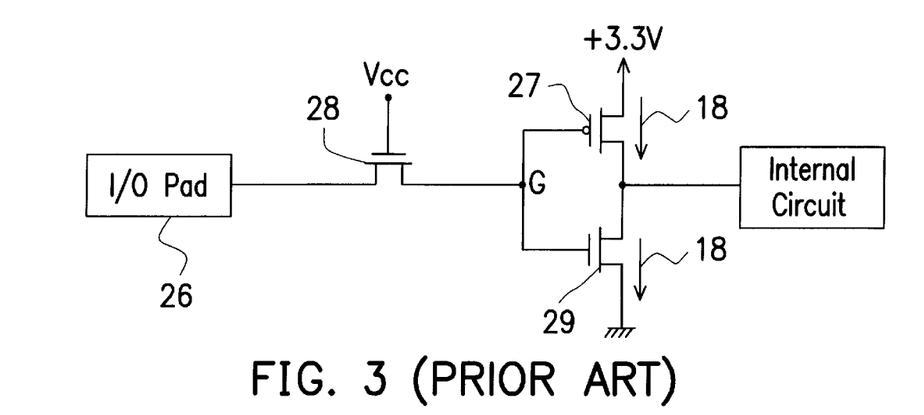
FIG. 3 is a schematic diagram of an input-stage circuit to conventional I/O circuit.

FIG. 3 shows the circuit structure of an input-stage circuit used in conventional I/O circuit, which is disclosed in U.S. Pat. No. 5,418,476 entitled "LOW VOLTAGE OUTPUT BUFFER WITH IMPROVED SPEED". As shown, the input-stage circuit includes an I/O pad 26, a PMOS transistor 27 and a pair of NMOS transistors 28, 29. In accordance with this patent, the NMOS transistor 28 is specifically arranged for the purpose of isolating the gate oxide of the NMOS transistor 29 from the I/O pad 26. When the 5 V system voltage is being input to the I/O pad 26, however, the voltage at the node G is $V_{CC}-V_{tN34}$, where $V_{tN34}$ is the threshold voltage of the NMOS transistor 28, which is insufficient to switch the NMOS transistor 29 on and the NMOS transistor 27 off, thus leading to the occurrence of a DC leakage current to flow through the PMOS transistor 27 and the NMOS transistor 29 to the ground, as indicated by the arrow 18 in FIG. 3. This DC leakage current undesirably increases the power consumption of the associated I/O circuit.

In conclusion, conventional I/O circuits have the following drawbacks:

(1) First, in the prior art of FIG. 1, the sourcing and sinking of the received system voltage are directed through the first and second PMOS transistors 11, 12 and the first and second NMOS transistors 13, 14, which causes an increase to the output impedance of the I/O circuit and thus a decrease in the signal transmission speed via the I/O circuit.

(2) Second, in the prior art of FIG. 2, the input of the 5 V system voltage to the I/O pad 20 when the I/O circuit operates in a high-impedance state causes stress to the gate oxide of the NMOS transistor 24, thus making the I/O circuit unreliable.

(3) Third, in an I/O circuit with the input-stage circuit shown in FIG. 3, a DC leakage current 18 occurs since the provision of the NMOS transistor 28 causes an insufficient gate voltage to switch on the NMOS transistor 29 and concurrently switch off the PMOS transistor 27, thus resulting in a high power consumption.

SUMMARY OF THE INVENTION

It is therefore an objective of the present invention to provide an I/O circuit, which has a higher I/O voltage tolerance as compared to the prior art, but which can be constructed by Single Gate-Oxide technology instead of Dual Gate-Oxide technology to save manufacturing cost.

It is another objective of the present invention to provide an I/O circuit, which can help eliminate the problems of the prior art including poor gate oxide reliability, PN junction inversion, and PMOS leakage.

It is still another objective of the present invention to provide an I/O circuit, which has a reduced output impedance as compared to the prior art so as to help increase the signal transmission speed.

It is still yet another objective of the present invention to provide an I/O circuit whose input-stage circuit is free from DC leakage current so that power consumption can be reduced as compared to the prior art.

In accordance with the foregoing and other objectives of the present invention, a new I/O circuit is proposed. This I/O circuit has a high I/O voltage tolerance that allows it to be suitable for use in conjunction with an IC device that operates with two system voltages, such as 3.3 V and 5 V. The particular circuit configuration of this I/O circuit allows it to be fabricated using the Single Gate-Oxide technology instead of Double Gate-Oxide technology so that the manufacturing cost is reduced as compared to the prior art. Moreover, this I/O circuit allows an output impedance lower than that of the prior art, allowing the signal transmission speed via this I/O circuit to be increased by about 30% as compared to the prior art. It can also help solve the problems of poor gate oxide reliability, PN junction inversion, and PMOS leakage that otherwise occur in the prior art. Furthermore, this I/O circuit can help eliminate the DC leakage current in the input-stage circuit, so that the power consumption can be reduced compared to the prior art.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

First Preferred Embodiment

A first preferred embodiment of the I/O circuit of the invention is disclosed in the following in full details with reference to FIGS. 4 and 5.

Figure 4:
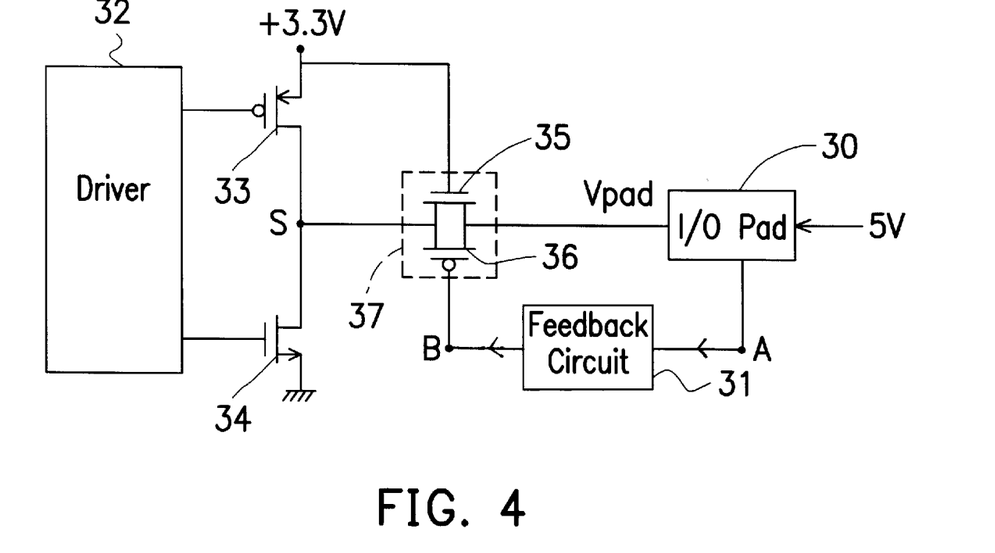
FIG. 4 is a schematic diagram of the I/O circuit according to the invention.

FIG. 4 is a schematic diagram of the basic circuit configuration of the I/O circuit according to the invention. This I/O circuit is designed for use in conjunction with an IC device (not shown) of the type operating with two system voltages including, for example, a first system voltage of 3.3 V and a second system voltage of 5 V. As shown, the I/O circuit of this embodiment includes an I/O pad 30, a feedback circuit 31, a driver 32, a transmission gate 37 (which is composed of a first NMOS transistor 35 and a first PMOS transistor 36), a second PMOS transistor 33, and a second NMOS transistor 34. The I/O pad 30 is connected to receive the higher one of the two system voltages, i.e., the 5 V system voltage in this embodiment. The input end of the transmission gate 37 is connected to the I/O pad 30 to receive the 5 V system voltage input to this I/O circuit via the I/O pad 30. The sourcing of the received voltage is then directed through the PMOS transistor 33, while the sinking is directed through the NMOS transistor 34. The ON/OFF states of the PMOS transistor 33 and the NMOS transistor 34 are controlled by the driver 32. Compared to the prior art, the output impedance is only about 2/3 of that of the prior art, so that the signal transmission speed can be increased by about 30%.

Figure 5:
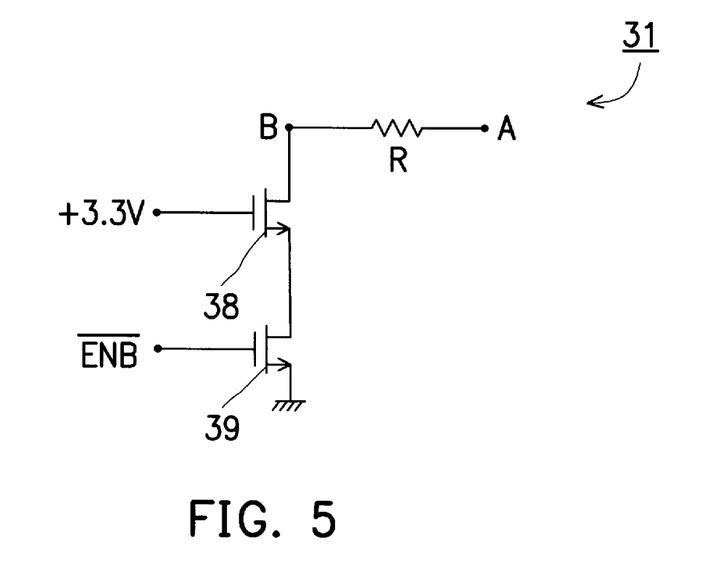
FIG. 5 is a schematic diagram of a first embodiment of the feedback circuit utilized in the I/O circuit of FIG. 4.

FIG. 5 is a schematic diagram of a first preferred embodiment of the feedback circuit 31 utilized in the I/O circuit of FIG. 4. As shown, the feedback circuit 31 includes a resistor R and a pair of NMOS transistors 38, 39. The resistor R is connected between the input end A and output end B of the feedback circuit 31. The NMOS transistor 38 has a gate connected to the lower one of the two system voltages, i.e., the 3.3 V system voltage, a source connected to the output end B of the feedback circuit 31, and a drain connected to the source of the NMOS transistor 39. The NMOS transistor 39 has a gate connected to receive an enable signal $\overline{ENB}$, a source connected to the drain of the NMOS transistor 38, and a drain connected to the ground.

When the I/O circuit operates in output mode, i.e., when the driver 32 switches on both the PMOS transistor 33 and the NMOS transistor 34, the enable signal $\overline{ENB}$ is set to a HIGH-voltage logic state, thereby causing the NMOS transistor 39 to be switched on. As a result, the output end B of the feedback circuit 31 is connected via the NMOS transistor 39 to the ground and thus being set at a LOW-voltage logic state. This condition causes the PMOS transistor 36 to be switched on (due to $V_g > V_t$), thus allowing full swing to the I/O pad 30.

On the other hand, when the I/O circuit is switched into a high-impedance state, i.e., when the driver 32 switches off both the PMOS transistor 33 and the NMOS transistor 34, the enable signal $\overline{ENB}$ is set to a LOW-voltage logic state, thereby causing the NMOS transistor 39 to be switched off. This then causes the output end B of the feedback circuit 31 to track the voltage at the input end A of the feedback circuit 31 via the resistor R; i.e., the output end B is set to 5 V, which is the system voltage received in by the I/O pad 30. This condition causes the PMOS transistor 36 to be switched off ($V_g < V_t$), and therefore, the voltage at the node S is set at to $3.3 - V_{tN35}$ (V), where $V_{tN35}$ is the threshold voltage of the NMOS transistor 35.

Second Preferred Embodiment

Figure 6:
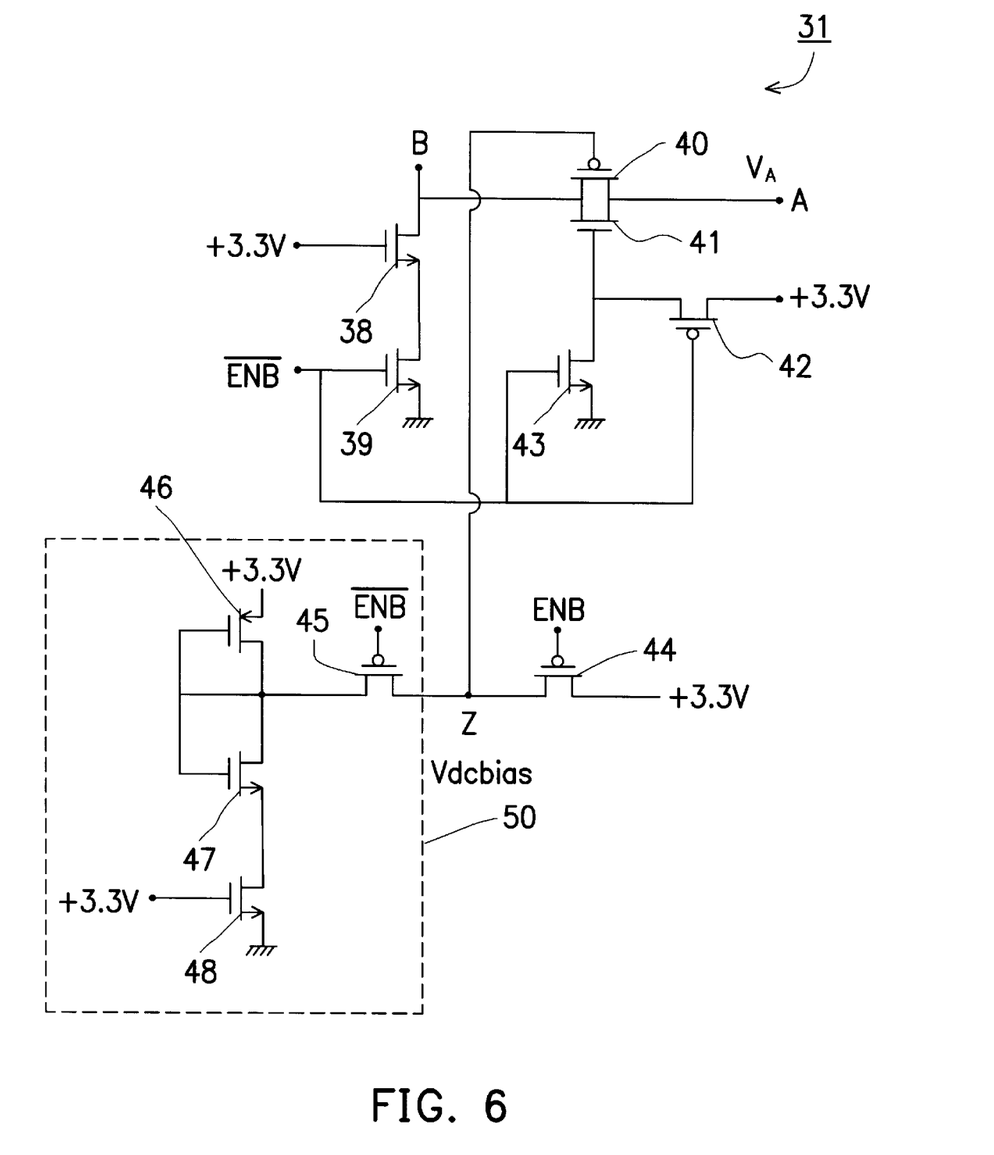
FIG. 6 is a schematic diagram of a second embodiment of the feedback circuit utilized in the I/O circuit of FIG. 4.

A second preferred embodiment of the I/O circuit of the invention is disclosed in the following in full details with reference to FIGS. 4 and 6. This embodiment differs from the previous one only in that the feedback circuit 31 is designed differently, as disclosed in FIG. 6. In the embodiment of FIG. 6, the same constituent components as those in the embodiment of FIG. 5 are labeled with the same reference numerals.

FIG. 6 is a schematic diagram of the second preferred embodiment of the feedback circuit 31 utilized in the I/O circuit of FIG. 4. As shown, the feedback circuit 31 of this example, in addition to the NMOS transistor 38 and the NMOS transistor 39, further includes a PMOS transistor 40, an NMOS transistor 41, a PMOS transistor 42, an NMOS transistor 43, a PMOS transistor 44, a PMOS transistor 45, an NMOS transistor 46, an NMOS transistor 47, and an NMOS transistor 48. The PMOS transistor 45, the NMOS transistor 46, the NMOS transistor 47, and the NMOS transistor 48 in combination constitute a bias circuit, as the part enclosed in the dashed box indicated by the reference numeral 50. Moreover, the PMOS transistor 40 and the NMOS transistor 41 in combination constitute a transmission gate. The input end of this transmission gate is connected to the input end A of the feedback circuit 31 so that it can receive the 5 V system voltage received by the I/O pad 30.

When the driver 32 switches on both the PMOS transistor 33 and the NMOS transistor 34, the enable signal $\overline{ENB}$ is set to a HIGH-voltage logic state (i.e., ENB is set to LOW-voltage logic state), thereby causing the NMOS transistor 39 to be switched on. As a result, the output end B of the feedback circuit 31 is connected the ground voltage and thereby is set to a LOW-voltage logic state. This condition causes the PMOS transistor 36 to be switched on ($V_g > V_t$), thus allowing full swing to the I/O pad 30.

On the other hand, when the driver 32 switches off both the PMOS transistor 33 and the NMOS transistor 34, the enable signal $\overline{ENB}$ is set to LOW-voltage logic state, thereby switching off the NMOS transistor 39, the NMOS transistor 43, and the PMOS transistor 44, while switching on the PMOS transistor 42 and the PMOS transistor 45. When the input voltage to the I/O pad 30 rises from 0 V to 3.3 V, it causes the NMOS transistor 35 (FIG. 4) to be switched on, thereby allowing the 3.3 V voltage to be directed via the NMOS transistor 35 to the node S. As a result, the voltage at node S can track the output voltage $V_{pad}$ at the I/O pad 30. When the condition $V_{pad} > 3.3 - V_{tN41}$ happens, where $V_{tN41}$ is the threshold voltage of the NMOS transistor 41, it causes the NMOS transistor 41 to be switched off. As a result, the output end B of the feedback circuit 31 is inhibited from tracking the voltage at the input end A of the feedback circuit 31. Moreover, this condition causes the voltage node Z to track the output bias voltage $V_{dcbias}$ from the bias circuit 50. As a result, when the voltage $V_A$ at the node A satisfies the condition $V_A > V_{dcbias} + V_{tP40}$, where $V_{tP40}$ is the threshold voltage of the PMOS transistor 40, it causes the PMOS transistor 40 to be switched on, thereby allowing the node B to track the voltage at the node A. As a result, the I/O circuit of the invention can help prevent the voltage at the node S (FIG. 4) to never exceed 3.3 V.

It can be learned from the foregoing description that the I/O circuit of the invention is characterized in the use of the feedback circuit 31 to allow the output end B to track the voltage at the input end A when the I/O circuit operates in a high-impedance state. As a result, when the input voltage to the I/O pad 30 exceeds 3.3 V, the voltage at the node S can nevertheless be maintained below 3.3 V, i.e., at $3.3 - V_{tN35}$, where $V_{tN35}$ is the threshold voltage of the NMOS transistor 35. Therefore, the I/O circuit of the invention can withstand the stress from the 5 V system voltage, thus providing a high I/O voltage tolerance. Moreover, by using the invention, the problems of the prior art, including poor gate oxide reliability, PN junction inversion, and PMOS leakage, can be eliminated.

Input Stage

Figure 7:
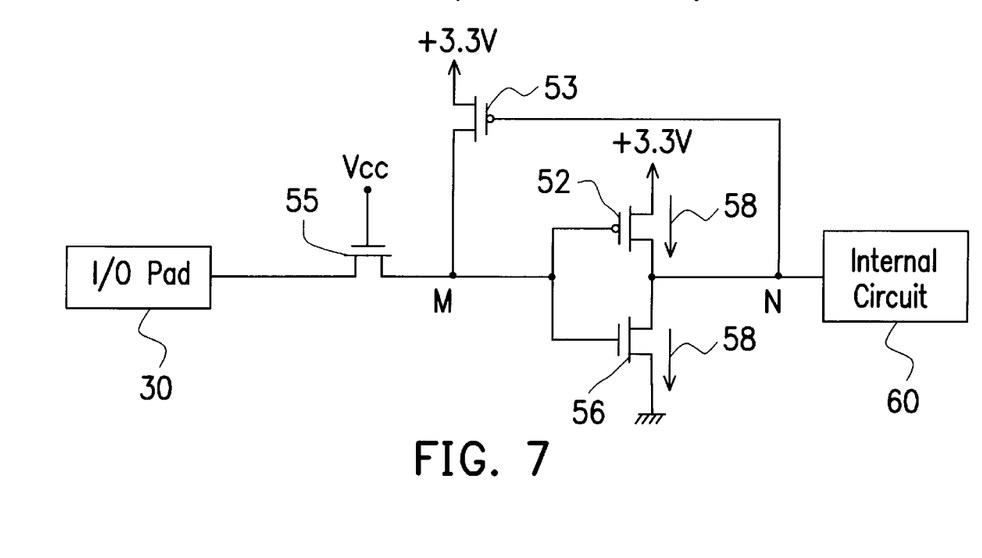
FIG. 7 is a schematic diagram of an input-stage circuit utilized by the I/O circuit of the invention.

FIG. 7 is a schematic diagram of an input-stage circuit that can be coupled to the I/O pad 30, i.e., between the I/O pad 30 of the I/O circuit shown in FIG. 4 and an IC device 60 that outputs the 5 V system voltage. As shown, the input-stage circuit includes a PMOS transistor 52, a PMOS transistor 53, an NMOS transistor 55, and an NMOS transistor 56.

When the IC device 60 outputs the 5 V system voltage to the I/O pad 30, the voltage at the node M is $V_{CC} - V_{tN55}$, where $V_{tN55}$ is the threshold voltage of the NMOS transistor 55. This voltage level is insufficient to switch the NMOS transistor 56 on and the PMOS transistor 52 off, thus causing a DC leakage current, as indicated by the arrow 58, to flow through the PMOS transistor 52 and the NMOS transistor 56 to the ground. Moreover, it causes the voltage at the node N to take on the ground voltage via the NMOS transistor 56, thus being set to a LOW-voltage logic state. This condition then causes the PMOS transistor 53 to be switched on, allowing the voltage at the node M to take on $V_{CC}$, which is sufficient to cause the NMOS transistor 56 and the PMOS transistor 52 to be switched off, thus causing the DC leakage current 58 to disappear. The power consumption by the input-stage circuit is therefore reduced as compared to the prior art.

In conclusion, the I/O circuit of the invention has the following advantages over the prior art.

(1) First, the I/O circuit of the invention can provide a high I/O voltage tolerance and can be fabricated using the Single Gate-Oxide technology instead of the Double Gate-Oxide technology, so that the manufacturing cost of the 1/0 circuit of the invention can be reduced as compared to the prior art.

(2) Second, the I/O circuit of the invention has an output impedance lower than that of the prior art, which allows the signal transmission speed via the I/O circuit of the invention to be increased by about 30% as compared to the prior art.

(3) Third, the invention can help solve the problems of poor gate oxide reliability, PN junction inversion, and PMOS leakage that would otherwise occur in the prior art.

(4) Fourth, the invention can help eliminate the DC leakage current in the input-stage circuit, so that the power consumption can be reduced compared to the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. An I/O circuit which operates between a first system voltage and a second system voltage, which comprises:
   an I/O pad for receiving the first system voltage;
   a transmission gate having an input end connected to the I/O pad and an output end connected to a common node, wherein the transmission gate is composed of a first NMOS transistor and a first PMOS transistor;
   a feedback circuit having an input end connected to the I/O pad and an output end connected to the gate of the first PMOS transistor in the transmission gate;
   a second PMOS transistor whose source is connected to the second system voltage and whose drain is connected to the common node; and
   a second NMOS transistor whose source is connected to the ground and whose drain is connected to the common node;
   wherein
   when the I/O circuit operates in output mode, one of the second PMOS transistors and the second NMOS transistors is switched on, causing the second end of the feedback circuit to be connected to the ground, allowing the I/O pad to achieve full swing;
   when the I/O circuit is put in a high-impedance state while both the second PMOS transistor and the second NMOS transistor are switched off and the first system voltage is smaller than the second system voltage, the voltage at the common node is enabled to track the first system voltage until reaching a magnitude substantially equal to the second system voltage minus the threshold voltage of the first NMOS transistor; and
   when the I/O circuit is put in a high-impedance state while both the second PMOS transistor and the second NMOS transistor are switched off and the first system voltage is larger than the second system voltage, the feedback circuit is enabled to cause the first PMOS transistor to be switched off, allowing the voltage at the common node to be maintained at the magnitude equal to the second system voltage minus the threshold voltage of the first NMOS transistor.

2. The I/O circuit of claim 1, further comprising:
   a driver which is capable of generating a first control signal to the gate of the second PMOS transistor to control the ON/OFF state of the second PMOS transistor and a second control signal to the gate of the second NMOS transistor to control the ON/OFF state of the second NMOS transistor.

3. The I/O circuit of claim 1, wherein the feedback circuit includes:
   a resistor having a first end connected to the input end of the feedback circuit and a second end connected to the output end of the feedback circuit;
   a third NMOS transistor, whose source is connected to the second end of the resistor, and whose gate is connected to the second system voltage; and
   a fourth NMOS transistor, whose source is connected to the drain of the third NMOS transistor, whose drain is connected to the ground, and whose gate is connected to an enable signal which is switched in such a manner that,
   when the I/O circuit operates in output mode, the enable signal is switched to a HIGH-voltage logic state, causing the fourth NMOS transistor to be switched on;
   when the I/O circuit is put in a high-impedance state, the enable signal is switched to a LOW-voltage logic state, causing the fourth NMOS transistor to be switched off.

4. The I/O circuit of claim 1, wherein the feedback circuit includes:
   a third PMOS transistor;
   a fifth NMOS transistor which is combined with the third PMOS transistor to constitute a second transmission gate having an input end connected to the input end of the feedback circuit and an output end connected to the output end of the feedback circuit;
   a bias circuit for supplying a bias voltage, wherein the bias voltage is transferred to the gate of the third PMOS transistor;
   a sixth NMOS transistor whose source is connected to the gate of the fifth NMOS transistor, whose drain is connected to the ground, and whose gate is connected to receive the enable signal;
   a fourth PMOS transistor, whose source is connected to the second system voltage, whose drain is connected to the source of the sixth NMOS transistor, and whose gate is connected to receive the enable signal;
   a fifth PMOS transistor, whose source is connected to the second system voltage, whose drain is connected to bias voltage output end of the bias circuit, and whose gate is connected to receive the complement of the enable signal;
   a seventh NMOS transistor, whose source is connected to the output end of the second transmission gate, and whose gate is connected to the second system voltage; and
   an eighth NMOS transistor, whose source is connected to the drain of the seventh NMOS transistor, whose drain is connected to the ground, and whose gate is connected to receive the enable signal;
   wherein the enable signal is switched in such a manner that:
   when the I/O circuit operates in output mode, the enable signal is switched to a HIGH-voltage logic state, thus switching on the eighth NMOS transistor, the sixth NMOS transistor, and the fifth PMOS transistor and concurrently switching off the fourth PMOS transistor;
   when the I/O circuit is put in a high-impedance state, the enable signal is switched to a LOW-voltage logic state, thus switching off the eighth NMOS transistor, the sixth NMOS transistor, and the fifth PMOS transistor and concurrently switching on the fourth PMOS transistor.

5. The I/O circuit of claim 1, further comprising an input-stage circuit coupled between the I/O pad and an internal circuit, the input-stage circuit comprising: a third NMOS transistor, a third PMOS transistor, a fourth NMOS transistor, and a fourth PMOS transistor, wherein the third NMOS transistor is coupled to the I/O pad from its source electrode, to a gate voltage from its gate, and to a node M from its drain electrode;
   the fourth NMOS transistor is couple to the node M from its gate, to a ground from its source, and to a node N from its drain electrode;
   the third PMOS transistor is coupled to the node N from its drain electrode, to the node M from its gate, and to the second system voltage from its source electrode; and
   the fourth PMOS is coupled to the node N from its gate, to the node M from its drain electrode, and to the second system voltage,
   wherein the internal circuit is coupled to the node N.

6. An I/O circuit which operates between a first system voltage and a second system voltage, with the first system voltage being larger than the second system voltage, comprising an I/O pad for receiving the first system voltage;

a transmission gate having an input end connected to the I/O pad and an output end connected to a common node, wherein the transmission gate is composed of a first NMOS transistor and a first PMOS transistor;

a feedback circuit having an input end connected to the I/O pad and an output end connected to the gate of the first PMOS transistor in the transmission gate;

a second PMOS transistor whose source is connected to the second system voltage and whose drain is connected to the common node;

a second NMOS transistor whose source is connected to the ground and whose drain is connected to the common node;

an input-stage circuit coupled to the I/O pad, the input-stage circuit including: a third NMOS transistor, whose source is connected to the I/O pad and whose gate is connected to receive a gate voltage; a third PMOS transistor, whose source is connected to the drain of the third NMOS transistor, whose drain is connected to the second system voltage, and whose gate is connected to the first system voltage; a fourth PMOS transistor, whose source is connected to the first system voltage, whose drain is connected to the second system voltage, and whose gate is connected to the drain of the third NMOS transistor; and a fourth NMOS transistor, whose source is connected to the ground, whose drain is connected to the first system voltage, and whose gate is connected to the drain of the third NMOS transistor;

wherein when the I/O circuit operates in output mode, one of the second PMOS transistor and the second NMOS transistor is switched on, causing the second end of the feedback circuit to be connected to the ground, allowing the I/O pad to achieve full swing;

when the I/O circuit is put in a high-impedance state while both the second PMOS transistor and the second NMOS transistor are switched off and the first system voltage is smaller than the second system voltage, the voltage at the common node is enabled to track the first system voltage until reaching a magnitude substantially equal to the second system voltage minus the threshold voltage of the first NMOS transistor; and when the I/O circuit is put in a high-impedance state while both the second PMOS transistor and the second NMOS transistor are switched off and the first system voltage is larger than the second system voltage, the feedback circuit is enabled to cause the first PMOS transistor to be switched off, allowing the voltage at the common node to be maintained at the magnitude equal to the second system voltage minus the threshold voltage of the first NMOS transistor.

7. The I/O circuit of claim 6, wherein the feedback circuit includes:

a resistor having a first end connected to the input end of the feedback circuit and a second end connected to the output end of the feedback circuit;

a fifth NMOS transistor, whose source is connected to the second end of the resistor, and whose gate is connected to the second system voltage; and a sixth NMOS transistor, whose source is connected to the drain of the fifth NMOS transistor, whose drain is connected to the ground, and whose gate is connected to an enable signal which is switched in such a manner that, when the I/O circuit operates in output mode, the enable signal is switched to a HIGH-voltage logic state, causing the sixth NMOS transistor to be switched on;

when the I/O circuit is put in a high-impedance state, the enable signal is switched to a LOW-voltage logic state, causing the sixth NMOS transistor to be switched off.

8. The I/O circuit of claim 6, wherein the feedback circuit includes:

a fifth PMOS transistor;

a seventh NMOS transistor which is combined with the fifth PMOS transistor to constitute a second transmission gate having an input end connected to the input end of the feedback circuit and an output end connected to the output end of the feedback circuit;

a bias circuit for supplying a bias voltage, wherein the bias voltage is transferred to the gate of the fifth PMOS transistor;

an eighth NMOS transistor whose source is connected to the gate of the seventh NMOS transistor, whose drain is connected to the ground, and whose gate is connected to receive the enable signal;

a sixth PMOS transistor, whose source is connected to the second system voltage, whose drain is connected to the source of the eighth NMOS transistor, and whose gate is connected to receive the enable signal;

a seventh PMOS transistor, whose source is connected to the second system voltage, whose drain is connected to a bias voltage output end of the bias circuit, and whose gate is connected to receive the complement of the enable signal;

a ninth NMOS transistor, whose source is connected to the output end of the second transmission gate, and whose gate is connected to the second system voltage; and a tenth NMOS transistor, whose source is connected to the drain of the ninth NMOS transistor, whose drain is connected to the ground, and whose gate is connected to receive the enable signal;

wherein the enable signal is switched in such a manner that:

when the I/O circuit operates in output mode, the enable signal is switched to a HIGH-voltage logic state, thus switching on the tenth NMOS transistor, the eight NMOS transistor, and the seventh PMOS transistor and concurrently switching off the sixth PMOS transistor;

when the I/O circuit is put in a high-impedance state, the enable signal is switched to a LOW-voltage logic state, thus switching off the tenth NMOS transistor, the eighth NMOS transistor, and the seventh PMOS transistor and concurrently switching on the sixth PMOS transistor.

9. The I/O circuit of claim 6, further comprising:

a driver which is capable of generating a first control signal to the gate of the second PMOS transistor to control the ON/OFF state of the second PMOS transistor and a second control signal to the gate of the second NMOS transistor to control the ON/OFF state of the second NMOS transistor.

10. An input-stage circuit used in an I/O circuit, coupled between an I/O pad of the I/O circuit and an internal circuit, the I/O pad receiving a first system voltage, the input-stage circuit comprising:

a third NMOS transistor, a third PMOS transistor, a fourth NMOS transistor, and a fourth PMOS transistor, wherein the third NMOS transistor is coupled to the I/O pad from its source electrode, to a gate voltage from its gate, and to a node M from its drain electrode;

the fourth NMOS transistor is couple to the node M from its gate, to a ground from its source, and to a node N from its drain electrode;

the third PMOS transistor is coupled to the node N from its drain electrode, to the node M from its gate, and to a second system voltage from its source electrode; and the fourth PMOS is coupled to the node N from its gate, to the node M from its drain electrode, and to the second system voltage, wherein the internal circuit is coupled to the node N.

* * * * *